(12) United States Patent
Chou

(10) Patent No.: US 12,238,867 B2
(45) Date of Patent: Feb. 25, 2025

(54) TEMPORARY STORAGE AND REFLOW FRAME SUBSTRATE SYSTEM

(71) Applicant: ECLAT FOREVER MACHINERY CO., LTD., Taoyuan (TW)

(72) Inventor: Kun-Lin Chou, Taoyuan (TW)

(73) Assignee: ECLAT FOREVER MACHINERY CO., LTD., Taoyuan (TW)

( * ) Notice: Subject to any disclaimer, the term of this patent is extended or adjusted under 35 U.S.C. 154(b) by 442 days.

(21) Appl. No.: 17/725,576

(22) Filed: Apr. 21, 2022

(65) Prior Publication Data

US 2023/0209794 A1    Jun. 29, 2023

(30) Foreign Application Priority Data

Dec. 27, 2021   (TW) .................................. 110215470

(51) Int. Cl.
*H05K 13/00* (2006.01)
*G03F 7/00* (2006.01)

(52) U.S. Cl.
CPC ..... *H05K 13/0061* (2013.01); *G03F 7/70991* (2013.01)

(58) Field of Classification Search
CPC .................................................... B65G 37/02
USPC .............. 198/346.1, 346.2, 465.2, 229.1
See application file for complete search history.

(56) References Cited

U.S. PATENT DOCUMENTS 10,070,567 B2 *   9/2018   Chen .................. H05K 13/0069

FOREIGN PATENT DOCUMENTS

JP    3232704 U   *   7/2021

OTHER PUBLICATIONS

Machine Translation of JP3232704 U (Year: 2021).*

* cited by examiner

Primary Examiner — William R Harp

(57) ABSTRACT

A temporary storage and reflow frame substrate system includes a substrate frame, a substrate loading and unloading station, a first conveying unit, and a second conveying unit. The substrate frame is suitable for loading the substrate. The substrate loading and unloading station includes a robotic arm, a feeding and discharging unit and a returning unit, the substrate frame is suitable for connecting to the feeding and discharging unit and the returning unit, the robotic arm is suitable to place the substrate into or remove the substrate from the substrate frame. The first conveying unit is connected to the feeding and discharging unit and is suitable for conveying the substrate frame. The second conveying unit is connected between the first conveying unit and the returning unit, in order to return the substrate frame to the returning unit, thereby loading and unloading the substrate at the substrate loading and unloading station.

10 Claims, 10 Drawing Sheets

1

18

TEMPORARY STORAGE AND REFLOW FRAME SUBSTRATE SYSTEM

This non-provisional application claims priority under 35 U.S.C. § 119(a) on Patent Application No(s). 110215470 filed in Taiwan, R.O.C. on Dec. 27, 2021, the entire contents of which are hereby incorporated by reference.

BACKGROUND OF THE INVENTION

1. Field of the Invention

The present disclosure provides a reflow system, and in particular to a temporary storage and reflow frame substrate system applied to develop and clean the substrate, thereby forming a circuit pattern on the substrate.

2. Description of the Related Art

Circuit substrate is an important application object in the high-tech electronics industry. Generally speaking, after the surface of the substrate is laid on the line, it is necessary to clean, develop, etch and peel film with special potions and solvents to meet the specifications and predetermined accuracy of each stage of the process and product use. However, at present, when the above processing steps are carried out for the substrate on the market, the feeding equipment and the discharging equipment must be respectively set up at two ends of the corresponding system, so that personnel must be sent at two ends of the system to monitor and convey the circuit substrate, thereby increasing the production cost and increasing the space occupied by the overall system.

BRIEF SUMMARY OF THE INVENTION

The inventor exhausted his mind to research carefully, and then developed a temporary storage and reflow frame substrate system, with a view to achieving the purposes of saving manpower, reducing production costs and saving space.

The disclosure provides a temporary storage and reflow frame substrate system for forming a circuit pattern on a substrate, the temporary storage and reflow frame substrate system comprising a substrate frame, a substrate loading and unloading station, a first conveying unit, and a second conveying unit. The substrate loading and unloading station includes a robotic arm, a feeding and discharging unit and a returning unit. The substrate frame is configured for loading the substrate. The substrate frame is configured for connecting to the feeding and discharging unit and the returning unit. The robotic arm is configured to place the substrate into or remove the substrate from the substrate frame. The first conveying unit is connected to the feeding and discharging unit and is suitable configured for conveying the substrate frame, so that the substrate loaded on the substrate frame is developed and cleaned during the conveying process. The second conveying unit is connected between the first conveying unit and the returning unit, the second conveying unit is configured to convey the substrate frame, so that the substrate loaded on the substrate frame returns to the substrate loading and unloading station after the completion of the process, in order to be taken down from the substrate frame by the robotic arm.

In an embodiment, the temporary storage and reflow frame substrate system of the disclosure further comprises a development and cleaning module. The development and cleaning module is disposed along the line of the first conveying unit, in order to develop and clean the substrate.

In an embodiment, the temporary storage and reflow frame substrate system of the disclosure further comprises a reinforced cleaning module. The reinforced cleaning module is disposed along the line of the first conveying unit and is relatively far from the feeding and discharging unit compared to the development and cleaning module.

In an embodiment, the temporary storage and reflow frame substrate system of the disclosure further comprises a temporary storage module, the temporary storage module is disposed along the line of the first conveying unit to temporarily store at least one substrate frame loaded with the substrate.

In an embodiment, the temporary storage module includes a slide rail, an active part and a plurality of temporary storage parts. The slide rail is disposed between the temporary storage parts and is oriented towards the first conveying unit with one end, the active part is slidingly disposed on the slide rail and corresponds to the first conveying unit, and the temporary storage parts also correspond to the first conveying unit.

In an embodiment, the temporary storage and reflow frame substrate system of the disclosure further comprises a steering module. The steering module includes a slide rail and an active unit, the slide rail is located at one end of the first conveying unit and the second conveying unit that is far from the substrate loading and unloading station, the active unit is slidingly disposed on the slide rail and corresponds to the first conveying unit and the second conveying unit, in order to be suitable-configured for joining the first conveying unit or the second conveying unit.

In an embodiment, the first conveying unit, the second conveying unit, the returning unit, the feeding and discharging unit and the active unit are provided with the same roller structure.

In an embodiment, the feeding and discharging unit is configured for horizontal movement, the returning unit is configured for vertical movement, the second conveying unit is configured to transfer the substrate frame loaded with substrate to the returning unit, the returning unit is configured to descend to join the feeding and discharging unit, so that the substrate frame is transferred to the feeding and discharging unit.

In an embodiment, after the substrate frame is transferred to the feeding and discharging unit, the feeding and discharging unit is configured to be moved horizontally to a starting point of the first conveying unit, the robotic arm is configured to unload the substrate from the substrate frame, and load another substrate to be processed onto the substrate frame.

In an embodiment, the substrate frame comprises a support structure, the support structure includes a back plate, a plurality of support beams and a plurality of support columns, the support beams are bridged to two sides of the substrate frame, the back plate is used to abut against the substrate and is opposed to the support beams, the support columns are connected between the support beams and the back plate.

Accordingly, regarding the temporary storage and reflow frame substrate system of the present disclosure, because the substrate can be loaded and unloaded at the substrate loading and unloading station, the purposes of saving manpower, reducing production costs and saving space can be achieved.

DETAILED DESCRIPTION OF THE INVENTION

To facilitate understanding of the object, characteristics and effects of this present disclosure, embodiments together with the attached drawings for the detailed description of the present disclosure are provided.

Figure 1:
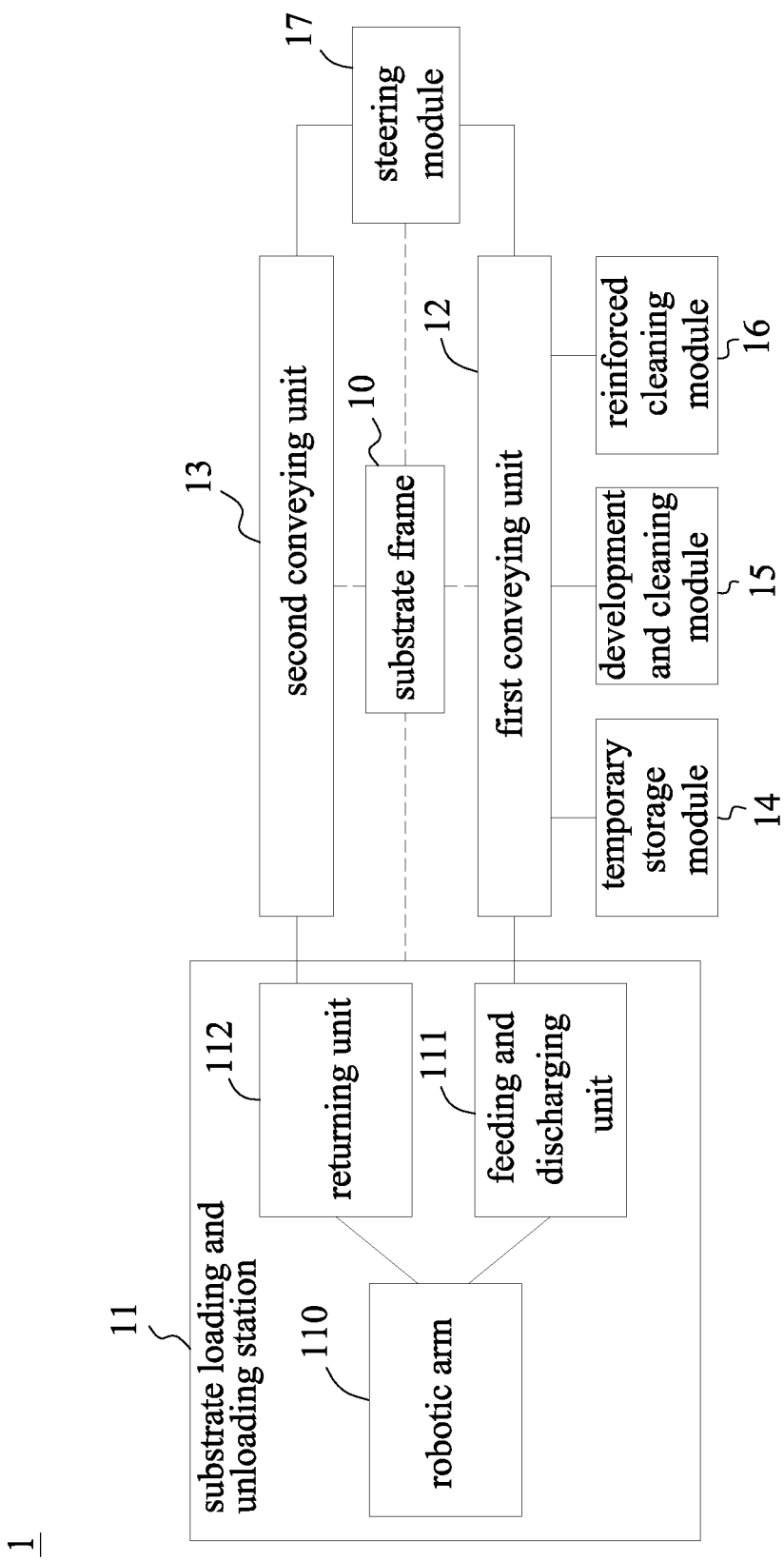
FIG. 1 is a schematic block diagram of a temporary storage and reflow frame substrate system according to an embodiment of the present disclosure.
Figure 3:
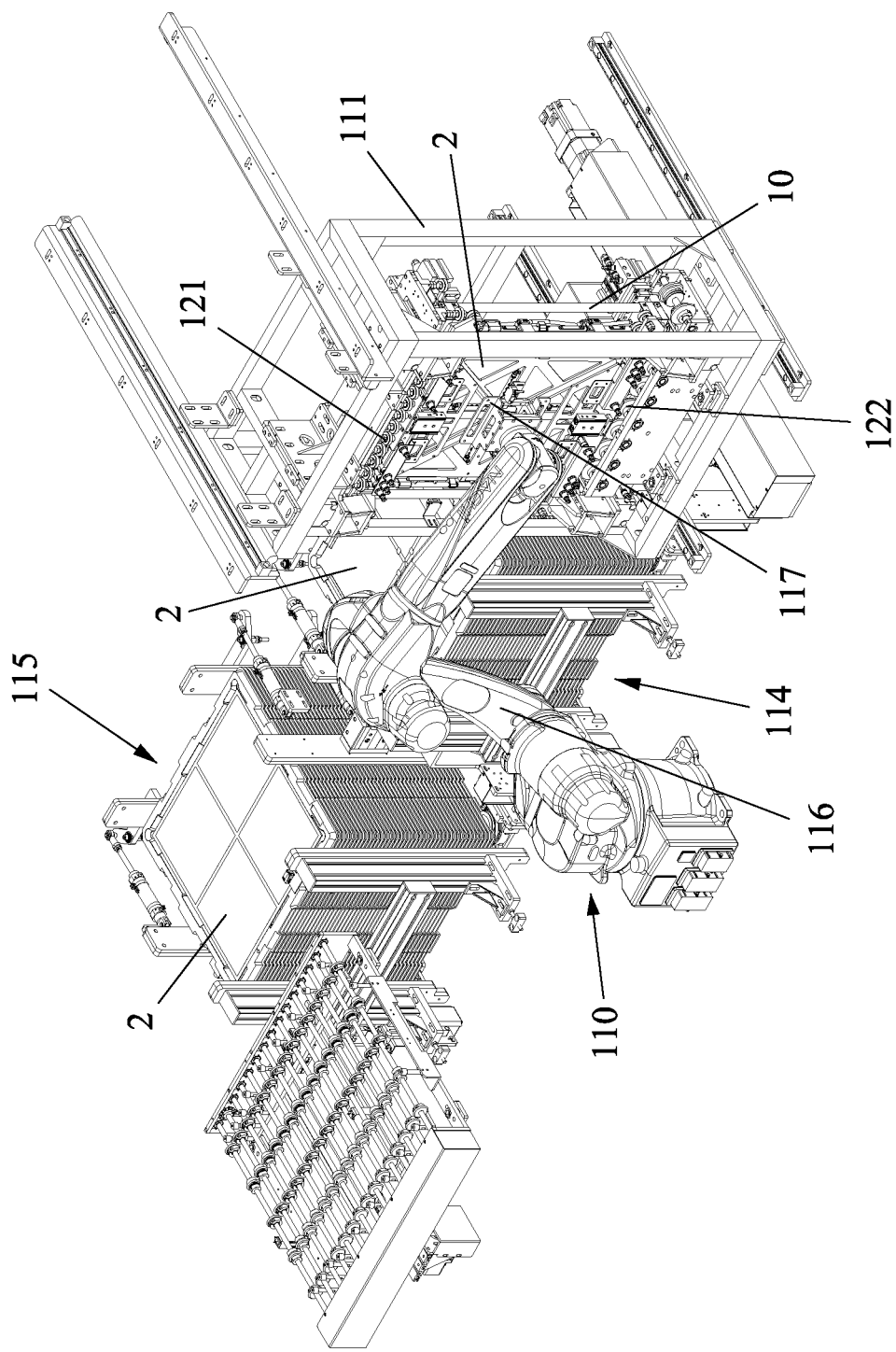
FIG. 3 is a schematic partial perspective view 1 of a substrate loading and unloading station of the temporary storage and reflow frame substrate system according to an embodiment of the present disclosure.

Referring to FIGS. 1 and 3, the present disclosure provides a temporary storage and reflow frame substrate system 1 for forming a circuit pattern on a substrate 2, the temporary storage and reflow frame substrate system 1 comprises a substrate frame 10, a substrate loading and unloading station 11, a first conveying unit 12 and a second conveying unit 13. The substrate loading and unloading station 11 includes a robotic arm 110, a feeding and discharging unit 111 and a returning unit 112. The substrate frame 10 is configured for loading the substrate 2. The substrate frame 10 is configured for connecting to the feeding and discharging unit 111 and the returning unit 112. The robotic arm 110 is configured to place the substrate 2 into or remove the substrate 2 from the substrate frame 10. The first conveying unit 12 is connected to the feeding and discharging unit 111 and is configured for conveying the substrate frame 10, so that the substrate 2 loaded on the substrate frame 10 is developed and cleaned during the conveying process. The second conveying unit 13 is connected between the first conveying unit 12 and the returning unit 112, the second conveying unit 13 is configured to convey the substrate frame 10, so that the substrate 2 loaded on the substrate frame 10 returns to the substrate loading and unloading station 11 after the completion of the process, in order to be taken down from the substrate frame 10 by the robotic arm 110.

As described above, regarding the temporary storage and reflow frame substrate system 1 of the present disclosure, because the substrate 2 can be loaded and unloaded at the substrate loading and unloading station 11, the purposes of saving manpower, reducing production costs and saving space can be achieved.

Figure 2:
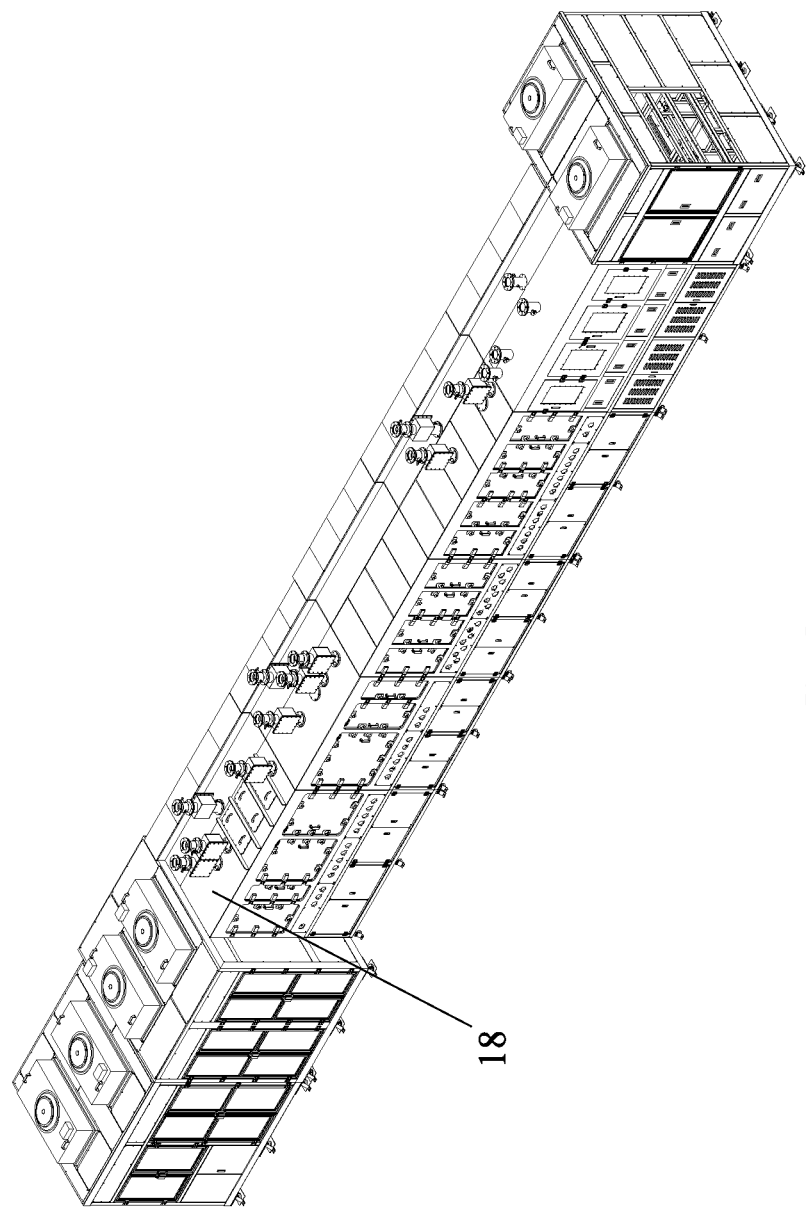
FIG. 2 is a schematic perspective view of the temporary storage and reflow frame substrate system according to an embodiment of the present disclosure.

As shown in FIG. 2, the temporary storage and reflow frame substrate system 1 of the present disclosure may be entirely located in a long strip of isolated production line room 18 to avoid external contamination during the development and cleaning process.

Figure 4:
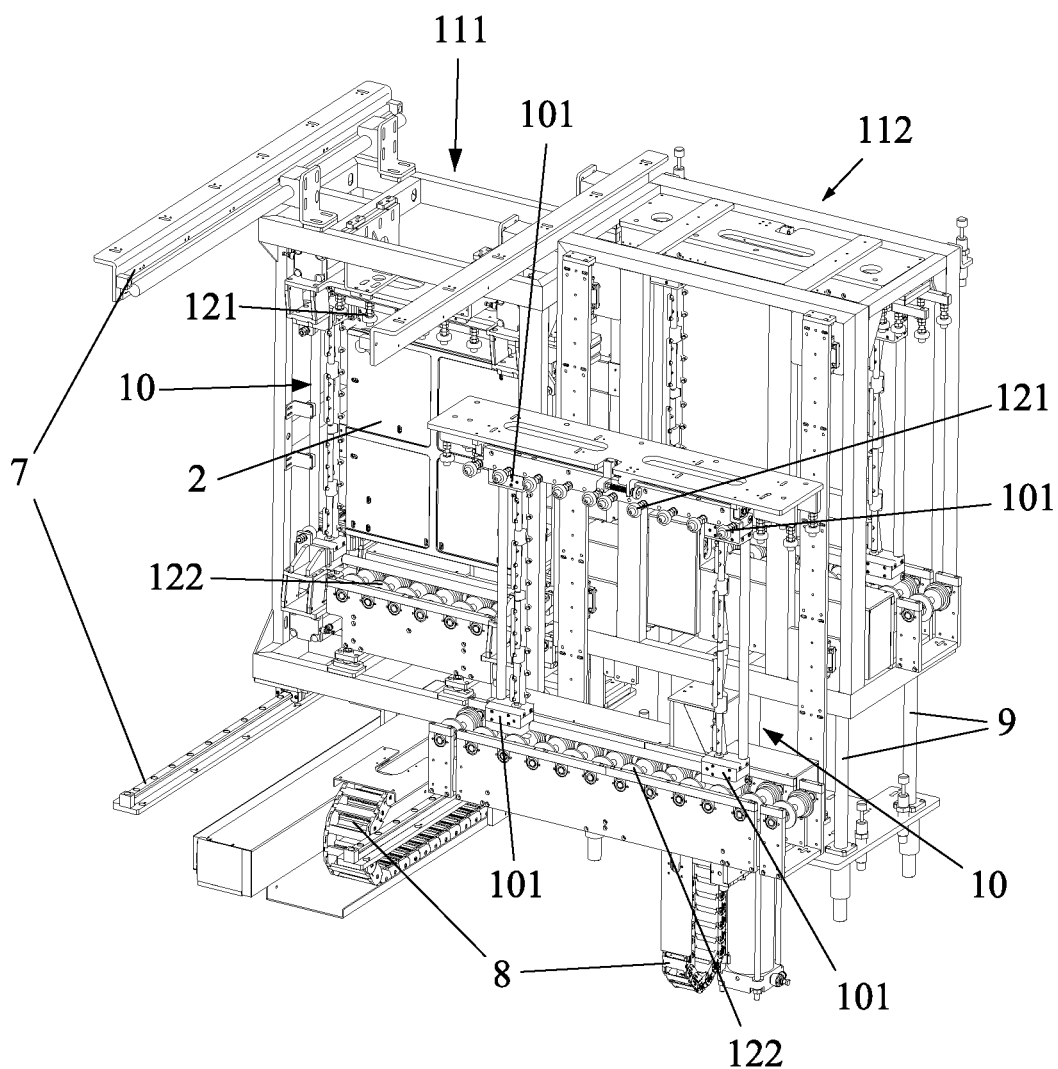
FIG. 4 is a schematic partial perspective view 2 of the substrate loading and unloading station of the temporary storage and reflow frame substrate system according to an embodiment of the present disclosure.
Figure 6:
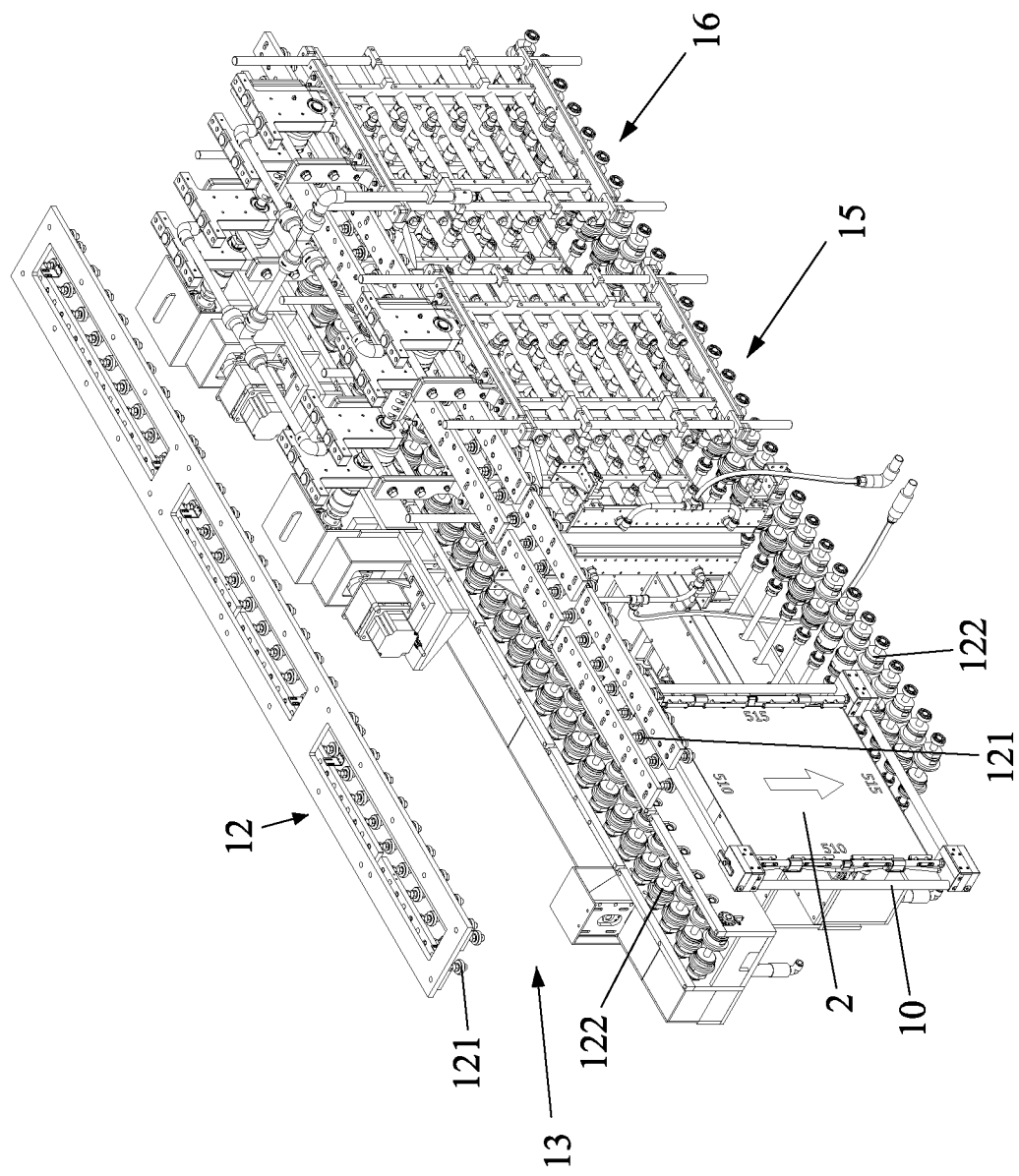
FIG. 6 is a schematic perspective view of a first conveying unit, a second conveying unit and a development and cleaning module of the temporary storage and reflow frame substrate system according to an embodiment of the present disclosure.

As shown in FIGS. 3, 4 and 6, in order to reduce the overall volume occupied by the temporary storage and reflow frame substrate system 1 of the present disclosure, there may be a height difference between the feeding and discharging unit 111 and the returning unit 112, for example, the returning unit 112 may be higher than the feeding and discharging unit 111. In an embodiment, the feeding and discharging unit 111 is configured for horizontal movement, the returning unit 112 is configured for vertical movement. When the substrate frame 10 loaded with substrate 2 after finishing the development, cleaning and other processes is transferred to the returning unit 112 from the second conveying unit 13, the returning unit 112 descends to join the feeding and discharging unit 111, so that the substrate frame 10 is transferred to the feeding and discharging unit 111. The feeding and discharging unit 111 may then be moved horizontally to a starting point of the first conveying unit 12. Next, the robotic arm 110 may first unload the substrate 2 from the substrate frame 10, and then load another substrate 2 to be processed onto the substrate frame 10. Next, the substrate 2 may be conveyed by means of the first conveying unit 12 for cleaning, development and other processes.

As shown in FIG. 3, the substrate loading and unloading station 11 may be further provided with a first tray 114 and a second tray 115. The first tray 114 is used for storing a plurality of substrates 2 that have not yet been developed, cleaned and other processes. The second tray 115 is used for storing a plurality of substrates 2 that has completed development, cleaning and other processes. The robotic arm 110 may include a multi-axis mechanism body 116 and an end effector 117 electrically connected to the end of the multi-axis mechanism body 116. The end effector 117 may be a frame for clamping, magnetically sucking or air-sucking the substrate 2.

Figure 5:
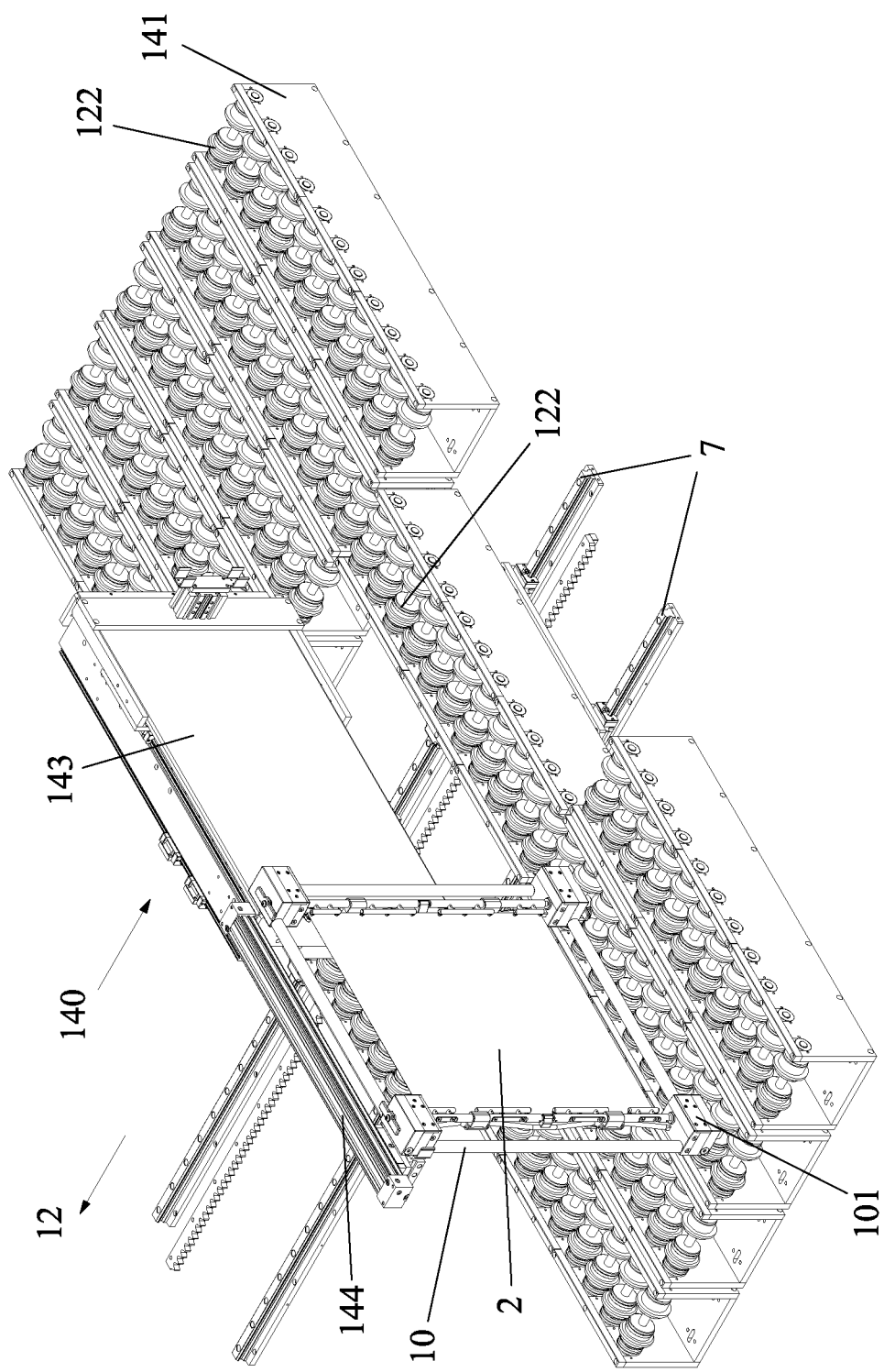
FIG. 5 is a schematic perspective view of a temporary storage module of the temporary storage and reflow frame substrate system according to an embodiment of the present disclosure.

As shown in FIGS. 4 and 5, the substrate frame 10 may be square, and may respectively have a holding portion 101 at four corners to hold or loosen the substrate 2. However, the method in which the substrate frame 10 holds the substrate 2 has been disclosed in the previous application of the inventor and thus will not be described in detail.

As shown in FIG. 4, the feeding and discharging unit 111 may be moved horizontally by a slide rail 7 going with a belt gear set 8, the returning unit 112 may be moved vertically by a guide rod 9 going with the belt gear set 8, but not limited thereto.

As shown in FIGS. 3, 4 and 6, the feeding and discharging unit 111 may be a frame corresponding to the first conveying unit 12. For example, the first conveying unit 12 is a roller mechanism comprising an upper roller set 121 and a lower roller set 122 to guide the substrate frame 10 to move, the feeding and discharging unit 111 is also provided with the same structure of the upper roller set 121 and the lower roller set 122. Similarly, the returning unit 112 may be a frame corresponding to the second conveying unit 13. Further, a roller structure of the second conveying unit 13 is also identical to the roller structure of the first conveying unit 12.

As shown in FIGS. 1, 3 and 5, the temporary storage and reflow frame substrate system 1 of the present disclosure may further comprise a temporary storage module 14. The temporary storage module 14 is disposed along the line of the first conveying unit 12 to temporarily store at least one substrate frame 10 loaded with the substrate 2. When the feeding and discharging unit 111 continuously transfers the substrate frame 10 to the first conveying unit 12, the substrate frame 10 may first be transferred to the temporary storage module 14, so as to avoid a blockage caused by the front substrates that have not yet completed development and cleaning. The temporary storage module 14 may include a slide rail 7, an active part 140 and a plurality of temporary storage parts 141. The slide rail 7 is disposed between the temporary storage parts 141 and is oriented towards the first conveying unit 12 with one end, the active part 140 is slidingly disposed on the slide rail 7 and corresponds to the roller structure of the first conveying unit 12, for example, the lower roller set 122 may be provided to be configured for conveying the substrate frame 10, the temporary storage parts 141 also correspond to the roller structure of the first conveying unit 12 and are configured with the lower roller set 122. The active part 140 is provided with a transfer frame 143 to connect the substrate frame 10, the transfer frame 143 may have a telescopic rod 144 for assembling the substrate frame 10, in order to transfer the substrate frame 10 to one of the temporary storage parts 141 for temporary storage from the active part 140, or transfer the substrate frame 10 to the active part 140 from the temporary storage part 141, so as to return to the first conveying unit 12 for development, cleaning and other processes. A servo motor (not shown) may be used to control the movement of the active part 140 on the slide rail 7, but not only limited thereto. Further, according to the needs of the process, it may be set the substrate frame 10 enters the temporary storage module 14 before or after the processes including development or cleaning.

As shown in FIGS. 1 and 6, in an embodiment, the temporary storage and reflow frame substrate system 1 of the present disclosure further comprises a development and cleaning module 15. The development and cleaning module 15 is disposed along the line of the first conveying unit 12, in order to develop and clean the substrate 2. The development and cleaning module 15 may spray a developer against the substrate 2 which is passing and a cleaning solution for removing the photoresist in a predetermined direction. A cleaning mechanism used for cleaning of the development and cleaning module 15 may oscillate reciprocatingly to enhance the cleaning effect. However, the applicant has already disclosed the technology of reciprocating oscillation in the previous application and thus will not describe in detail. Further, the temporary storage and reflow frame substrate system 1 of the present disclosure may further include a reinforced cleaning module 16. The reinforced cleaning module 16 is disposed along the line of the first conveying unit 12 and is relatively far from the feeding and discharging unit 111 compared to the development and cleaning module 15. The reinforced cleaning module 16 may provide a spray cleaning solution against the substrate 2 to remove the residual photoresist as much as possible. After the substrate 2 completes the development, cleaning and other processes, it can be dried. For example, high-pressure air may be used to remove the developer and cleaning solution remaining on the substrate 2.

Figure 7:
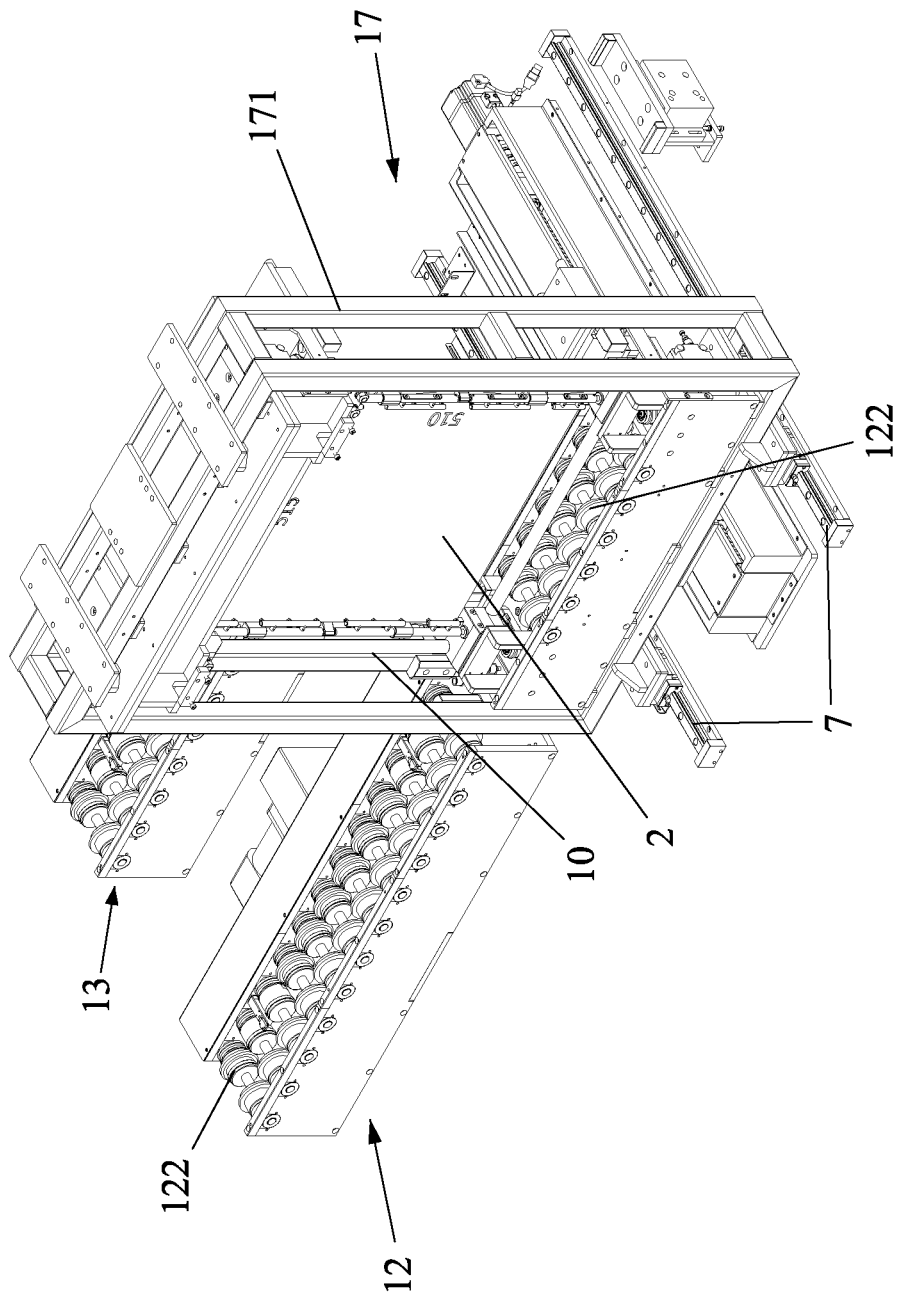
FIG. 7 is a schematic perspective view 1 of the first conveying unit, the second conveying unit and a steering module of the temporary storage and reflow frame substrate system according to an embodiment of the present disclosure.
Figure 8:
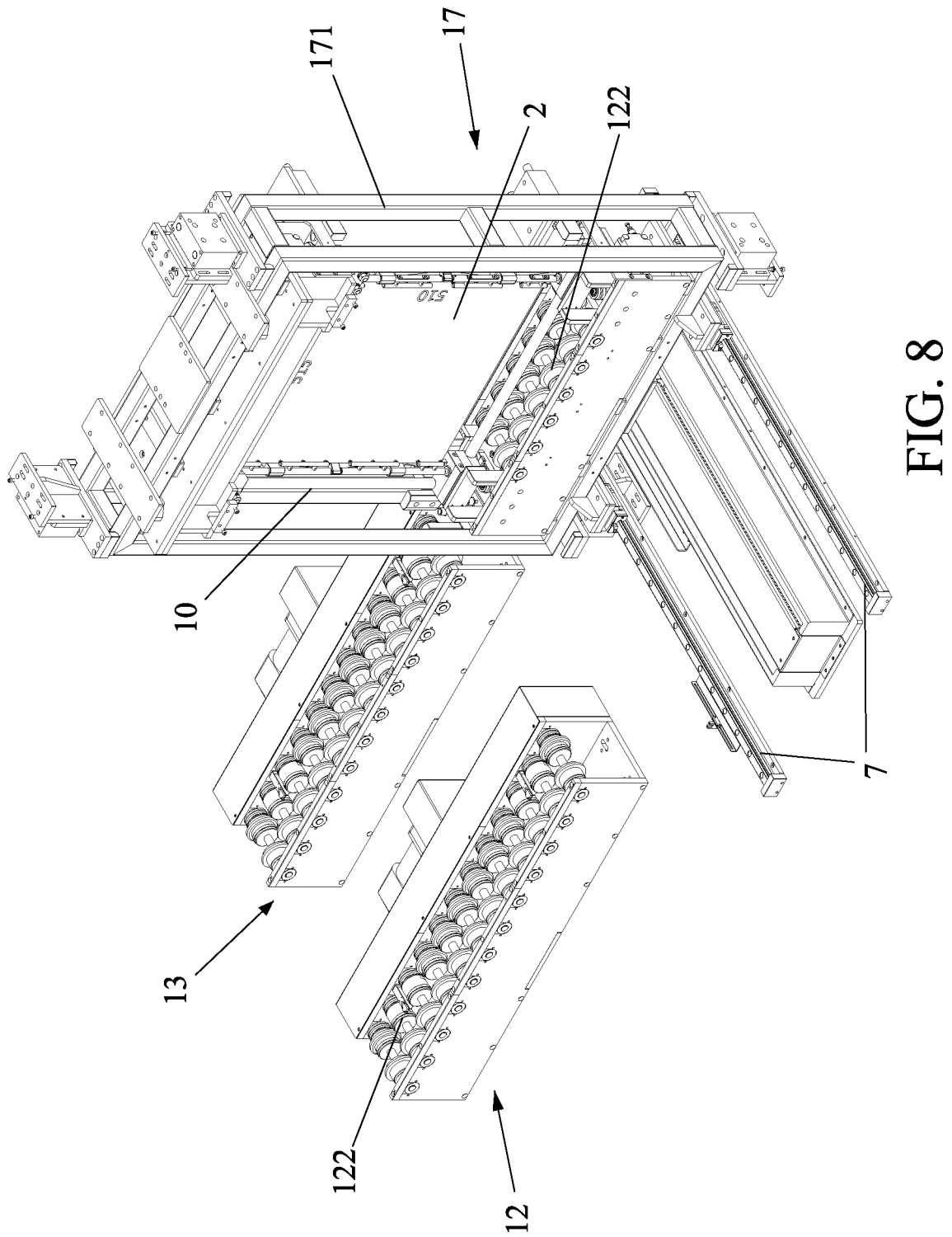
FIG. 8 is a schematic perspective view 2 of the first conveying unit, the second conveying unit and the steering module of the temporary storage and reflow frame substrate system according to an embodiment of the present disclosure.

As shown in FIGS. 1, 7 and 8, in an embodiment, the temporary storage and reflow frame substrate system 1 of the present disclosure may further comprise a steering module 17. The steering module 17 includes a slide rail 7 and an active unit 171. The slide rail 7 is located at one end of the first conveying unit 12 and the second conveying unit 13 that is far from the substrate loading and unloading station 11, the active unit 171 is slidingly disposed on the slide rail 7 and configured for joining the first conveying unit 12 or the second conveying unit 13. The active unit 171 may be a frame, and provided with a roller structure corresponding to the first conveying unit 12 and the second conveying unit 13, for example, may be provided with at least the lower roller set 122. Similarly, a servo motor may also be used to control the movement of the active unit 171 on the slide 7. The substrate frame 10 loaded with the substrate 2 may first be transferred to the active unit 171 from the first conveying unit 12, and then the active unit 171 is moved to the front of the second conveying unit 13 to transfer to the second conveying unit 13, thereby reflowing to the substrate loading and unloading station 11.

Figure 9:
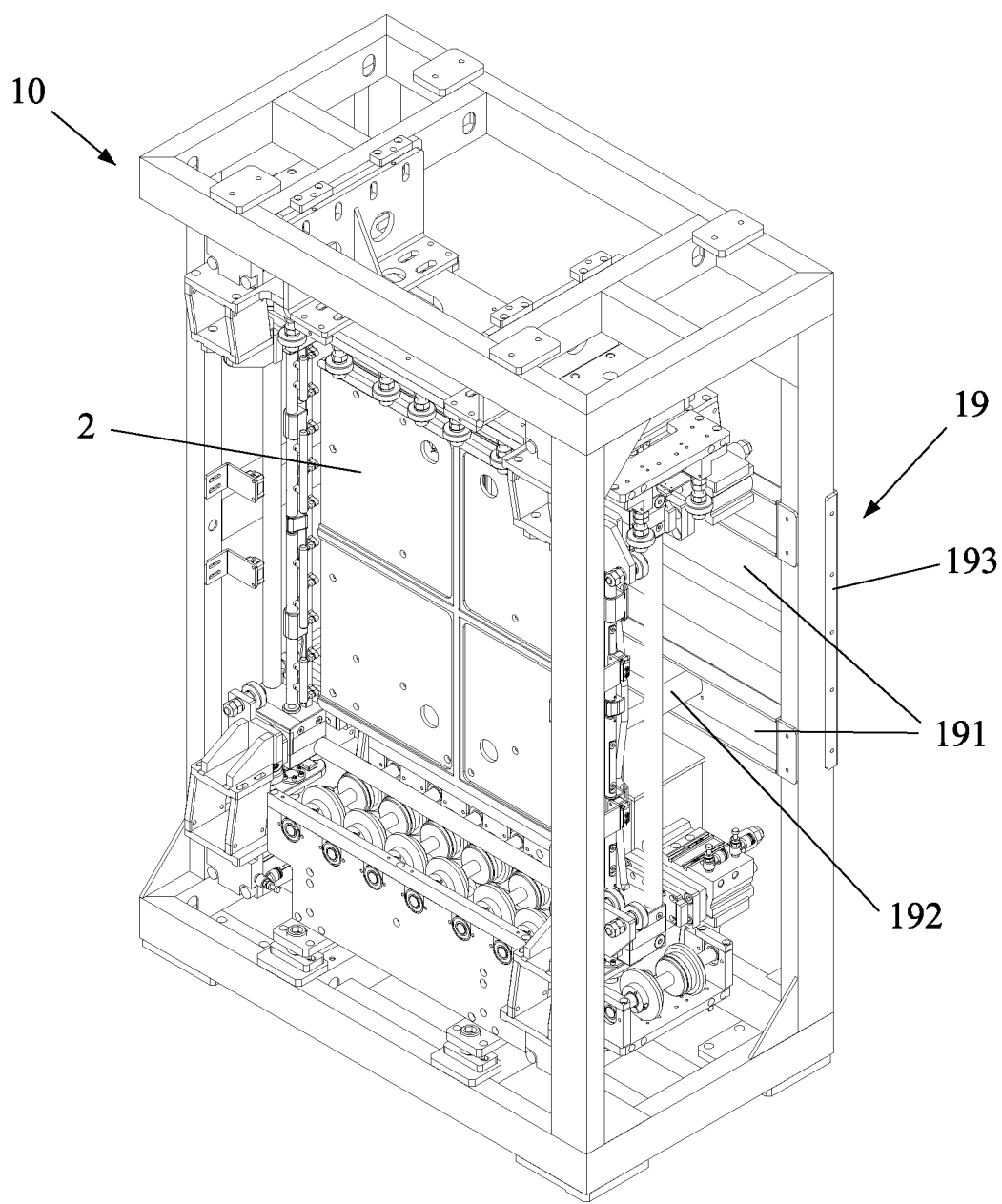
FIG. 9 is a schematic perspective view of a substrate frame including a support structure and loaded with the substrate according to an embodiment of the present disclosure.
Figure 10:
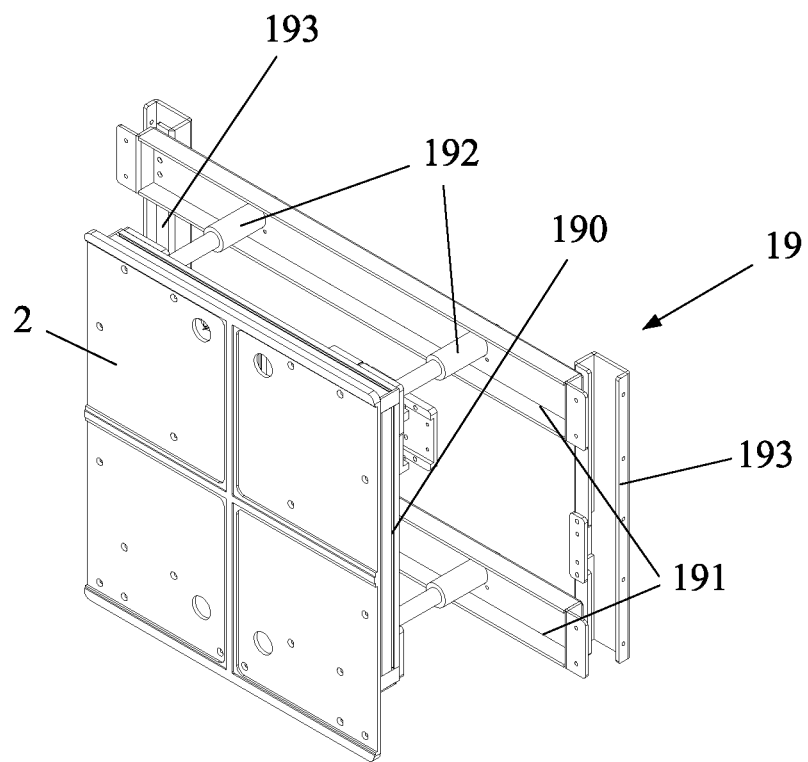
FIG. 10 is a schematic perspective view of the support structure and the substrate of FIG. 9.

As shown in FIGS. 3, 9 and 10, when the end effector 117 of the robotic arm 110 has the function of magnetic suction or air suction, in order to improve the success rate of adsorbing the substrate 2, in an embodiment, the substrate frame 10 may comprise a support structure 19. The support structure 19 includes a back plate 190, a plurality of support beams 191 and a plurality of support columns 192. The support beams 191 are bridged to two sides of the substrate frame 10, the back plate 190 is used to abut against the substrate 2 and is opposed to the support beams 191. The support columns 192 are connected between the support beams 191 and the back plate 190. The support structure 19 may further comprise two grips 193, each grip 193 is striped and bridged to the support beams 191, each grip 193 is held and fixed to one side of the substrate frame 10. Since the back side of the substrate 2 is supported, when the end effector 117 adsorbs the substrate 2, the substrate 2 will not move in the direction of adsorption, thereby effectively improving the success rate of adsorption.

While the present disclosure has been described by means of specific embodiments, numerous modifications and variations could be made thereto by those skilled in the art without departing from the scope and spirit of the present disclosure set forth in the claims. Therefore, the protection scope of the disclosure shall be defined by the claims.

What is claimed is:

1. A temporary storage and reflow frame substrate system, for forming a circuit pattern on a substrate, the temporary storage and reflow frame substrate system comprising:
    a substrate frame, configured for loading the substrate;
    a substrate loading and unloading station, including a robotic arm, a feeding and discharging unit and a returning unit, the substrate frame is configured for connecting to the feeding and discharging unit and the returning unit, the robotic arm is configured to place the substrate into or remove the substrate from the substrate frame;
    a first conveying unit, connected to the feeding and discharging unit and is configured for conveying the substrate frame, so that the substrate loaded on the substrate frame is developed and cleaned during the conveying process; and
    a second conveying unit, connected between the first conveying unit and the returning unit, the second conveying unit is configured to convey the substrate frame, so that the substrate loaded on the substrate frame returns to the substrate loading and unloading station after the completion of the process, in order to be taken down from the substrate frame by the robotic arm, wherein the substrate frame comprises a support structure, the support structure includes a back plate, a plurality of support beams and a plurality of support columns, the support beams are bridged to two sides of the substrate frame, the back plate is used to abut against the substrate and is opposed to the support beams, the support columns are connected between the support beams and the back plate.

2. The temporary storage and reflow frame substrate system according to claim 1, further comprising a development and cleaning module, the development and cleaning module is disposed along the line of the first conveying unit, in order to develop and clean the substrate.

3. The temporary storage and reflow frame substrate system according to claim 2, further comprising a reinforced cleaning module, the reinforced cleaning module is disposed along the line of the first conveying unit and is relatively far from the feeding and discharging unit compared to the development and cleaning module.

4. The temporary storage and reflow frame substrate system according to claim 1, further comprising a temporary storage module, the temporary storage module is disposed along the line of the first conveying unit to temporarily store at least one substrate frame loaded with the substrate.

5. The temporary storage and reflow frame substrate system according to claim 4, wherein the temporary storage module includes a slide rail, an active part and a plurality of temporary storage parts, the slide rail is disposed between the temporary storage parts and is oriented towards the first conveying unit with one end, the active part is slidingly disposed on the slide rail and corresponds to the first conveying unit, and the temporary storage parts also correspond to the first conveying unit.

6. The temporary storage and reflow frame substrate system according to claim 5, wherein the first conveying unit, the second conveying unit, the returning unit and the feeding and discharging unit are provided with the same roller structure.

7. The temporary storage and reflow frame substrate system according to claim 1, further comprising a steering module, the steering module includes a slide rail and an active unit, the slide rail is located at one end of the first conveying unit and the second conveying unit that is far from the substrate loading and unloading station, the active unit is slidingly disposed on the slide rail and corresponds to the first conveying unit and the second conveying unit, in order to be configured for joining the first conveying unit or the second conveying unit.

8. The temporary storage and reflow frame substrate system according to claim 7, wherein the first conveying unit, the second conveying unit, the returning unit and the feeding and discharging unit are provided with the same roller structure.

9. The temporary storage and reflow frame substrate system according to claim 1, wherein the feeding and discharging unit is configured for horizontal movement, the returning unit is configured for vertical movement, the second conveying unit is configured to transfer the substrate frame loaded with substrate to the returning unit, the returning unit is configured to descend to join the feeding and discharging unit, so that the substrate frame is transferred to the feeding and discharging unit.

10. The temporary storage and reflow frame substrate system according to claim 9, wherein after the substrate frame is transferred to the feeding and discharging unit, the feeding and discharging unit is configured to be moved horizontally to a starting point of the first conveying unit, the robotic arm is configured to unload the substrate from the substrate frame, and load another substrate to be processed onto the substrate frame.

* * * * *